US012789516B2

(12) United States Patent
Fukushima et al.

(10) Patent No.: US 12,789,516 B2
(45) Date of Patent: Nov. 10, 2026

(54) SUBSTRATE BONDING APPARATUS AND SUBSTRATE BONDING METHOD WITH PRESSURE CONTROL

(71) Applicant: Tokyo Electron Limited, Tokyo (JP)

(72) Inventors: Hideyuki Fukushima, Koshi City (JP); Manju Choi, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 390 days.

(21) Appl. No.: 18/467,071

(22) Filed: Sep. 14, 2023

(65) Prior Publication Data

US 2024/0096846 A1 Mar. 21, 2024

(30) Foreign Application Priority Data

Sep. 15, 2022 (JP) ................................ 2022-147267

(51) Int. Cl.
*B32B 37/10* (2006.01)
*B32B 37/00* (2006.01)
(Continued)

(52) U.S. Cl.
CPC .......... *B32B 37/0046* (2013.01); *B32B 37/10* (2013.01); *B32B 41/00* (2013.01);
(Continued)

(58) Field of Classification Search
CPC ..... B32B 37/0046; B32B 37/10; B32B 41/00; B32B 2457/14; B32B 37/0038;
(Continued)

(56) References Cited

U.S. PATENT DOCUMENTS

2010/0071847 A1* 3/2010 Shin .................... H10P 72/0428 156/382
2011/0089137 A1* 4/2011 Tanaka .................... H10P 70/20 216/13

(Continued)

FOREIGN PATENT DOCUMENTS

JP 2015-095579 A 5/2015
JP 2019-533897 A 11/2019

*Primary Examiner* — Duy T Nguyen
(74) *Attorney, Agent, or Firm* — Chrisman Gallo Tochtrop LLC

(57) ABSTRACT

A bonding apparatus includes a first holder, a second holder, an attracting pressure generator, a pushing member and a controller. The controller attracts a second substrate with a beginning attracting pressure distribution set on multiple regions, when a pressurization of a first substrate by the pushing member is begun. The controller performs a control of performing a switchover from the beginning attracting pressure distribution to a progress attracting pressure distribution between a time point when the pressurization by the pushing member is begun and a contact end point at which an entire bonding surface of the first substrate and an entire bonding surface of the second substrate come into contact with each other. The progress attracting pressure distribution is created by changing at least one attracting pressure of attracting pressures on the multiple regions in the beginning attracting pressure distribution.

8 Claims, 14 Drawing Sheets

(51) Int. Cl.
*B32B 41/00* (2006.01)
*H10W 72/00* (2026.01)

(52) U.S. Cl.
CPC ... *B32B 2457/14* (2013.01); *H10W 72/07163* (2026.01); *H10W 72/07331* (2026.01)

(58) Field of Classification Search
CPC ........... B32B 38/1858; B32B 38/1841; H10W 72/07163; H10W 72/07331; H10W 95/00; H10P 72/0428; H10P 72/70; H10P 72/78; H10P 72/0438; H10P 10/128; H01L 24/75
USPC ............................................................ 438/455
See application file for complete search history.

(56) References Cited

U.S. PATENT DOCUMENTS

| | | | | |
|---|---|---|---|---|
| 2013/0312907 | A1* | 11/2013 | Oh | B32B 38/1858 156/382 |
| 2014/0338813 | A1* | 11/2014 | Ookawa | B32B 37/10 156/60 |
| 2017/0087575 | A1* | 3/2017 | Hashima | B05B 12/004 |
| 2021/0327773 | A1* | 10/2021 | Kohama | H10P 72/0428 |
| 2023/0067346 | A1* | 3/2023 | Chen | H10P 72/78 |

* cited by examiner

AFTER PROGRESS OF BONDING IS TEMPORARILY STOPPED

AT THE BEGINNING OF BONDING

SUBSTRATE BONDING APPARATUS AND SUBSTRATE BONDING METHOD WITH PRESSURE CONTROL

CROSS-REFERENCE TO RELATED APPLICATION

This application claims the benefit of Japanese Patent Application No. 2022-147267 filed on Sep. 15, 2022, the entire disclosures of which are incorporated herein by reference.

TECHNICAL FIELD

The various aspects and embodiments described herein pertain generally to a bonding apparatus and a bonding method.

BACKGROUND

Patent Document 1 discloses a bonding apparatus equipped with an upper chuck for attracting a substrate at an upper side from above and a lower chuck for attracting a substrate at a lower side from below, and configured to bond the two substrate to face each other. To bond the substrates, the bonding apparatus presses a center of the substrate of the upper chuck into contact with a center of the substrate of the lower chuck, bonds the centers of the two substrates to each other by an intermolecular force, and expands this bonding region from the centers to edges of the substrates.

Further, in the bonding apparatus described in Patent Document 1, an attraction surface of the lower chuck is divided into a plurality of regions, and an attracting pressure is set for each of the regions individually during the bonding to increase bonding strength between the substrate of the upper chuck and the substrate of the lower chuck.

Patent Document 1: Japanese Patent Laid-open Publication No. 2015-095579

SUMMARY

In one exemplary embodiment, a bonding apparatus includes a first holder configured to hold a first substrate; a second holder, allowed to be disposed at a position facing the first holder, having an attraction surface partitioned into multiple regions configured to attract a second substrate; an attracting pressure generator configured to generate attracting pressures in the multiple regions individually; a pushing member configured to press a central portion of the first substrate toward the second substrate to bond the first substrate to the second substrate; and a controller configured to control the attracting pressure generator and the pushing member. The controller attracts the second substrate with a beginning attracting pressure distribution set on the multiple regions, when a pressurization of the first substrate by the pushing member is begun. The controller performs a control of performing a switchover from the beginning attracting pressure distribution to a progress attracting pressure distribution between a time point when the pressurization by the pushing member is begun and a contact end point at which an entire bonding surface of the first substrate and an entire bonding surface of the second substrate come into contact with each other. The progress attracting pressure distribution is created by changing at least one attracting pressure of the attracting pressures on the multiple regions in the beginning attracting pressure distribution.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
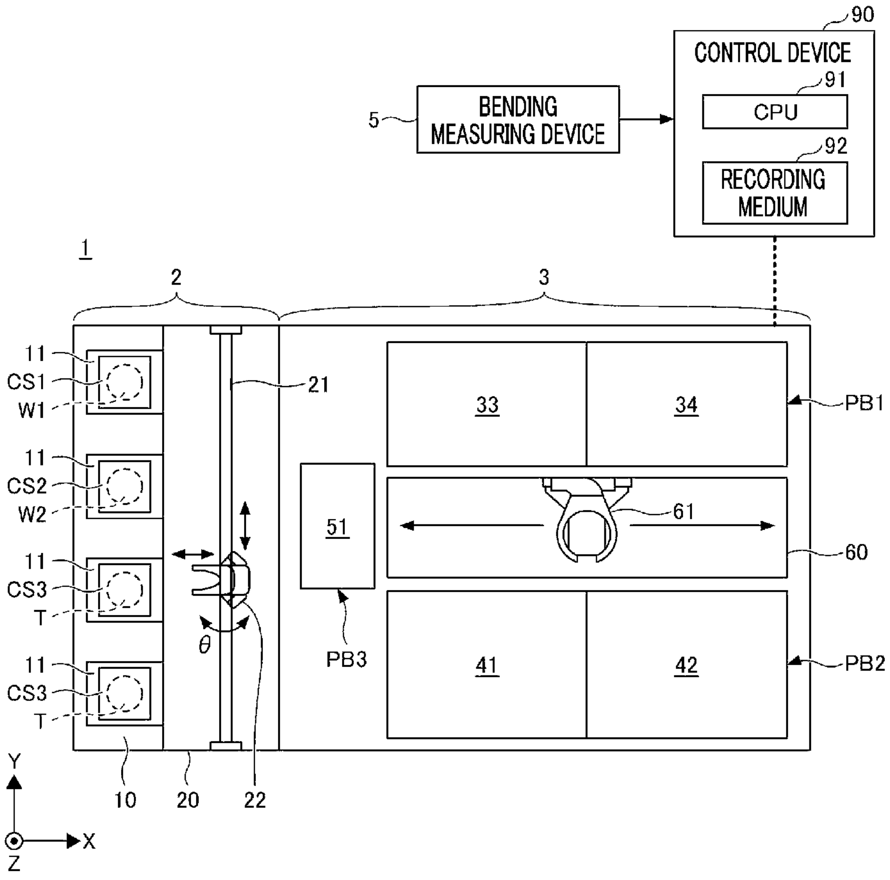
FIG. 1 is a plan view illustrating a bonding apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same parts will be assigned same reference numerals, and redundant description will be omitted.

Figure 2:
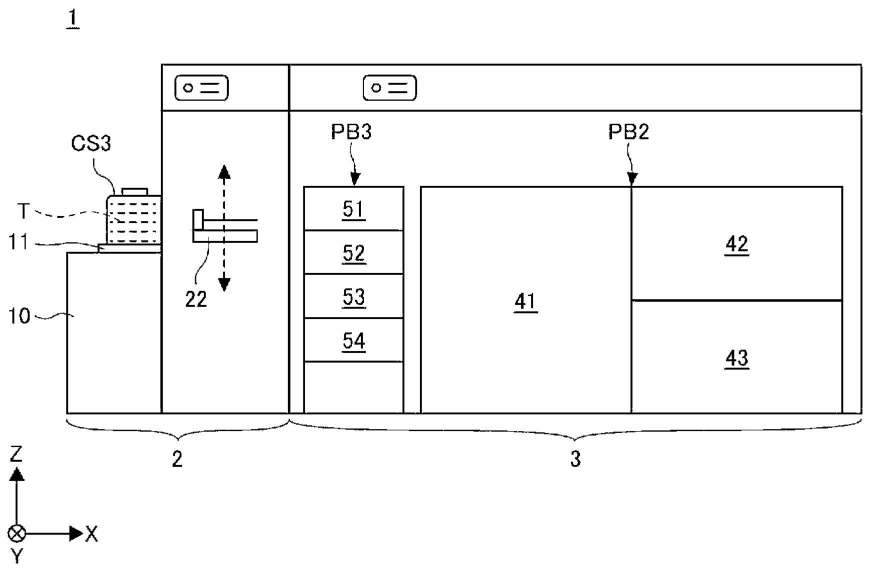
FIG. 2 is a side view illustrating the bonding apparatus of FIG. 1.

As depicted in FIG. 1 and FIG. 2, a bonding apparatus 1 according to an exemplary embodiment is an apparatus configured to produce a bonded substrate T by transferring two substrates (a first substrate W1 and a second substrate W2) and bonding these two substrates to each other.

At least one of the first substrate W1 or the second substrate W2 is a substrate on which a plurality of electronic circuits are formed on a semiconductor substrate such as, but not limited to, a silicon wafer or a compound semiconductor wafer. One of the first substrate W1 and the second substrate W2 may be a bare wafer on which no electronic circuit is formed. Although not particularly limited, the compound semiconductor wafer may be, for example, a GaAs wafer, a SiC wafer, a GaN wafer, or an InP wafer.

Figure 3:
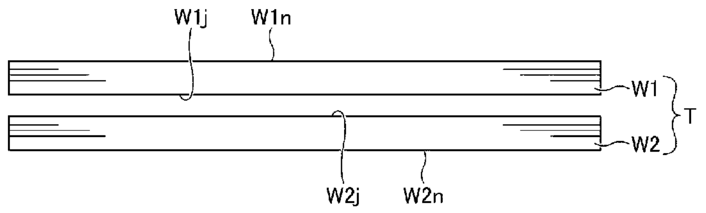
FIG. 3 is a side view illustrating an example of a first substrate and a second substrate.

The first substrate W1 and the second substrate W2 are formed on circular plates having substantially the same shape (same diameter). As shown in FIG. 3, the bonding apparatus 1 places the second substrate W2 on the negative Z-axis side of (vertically under) the first substrate W1, and bonds the first substrate W1 and the second substrate W2. Therefore, hereinafter, the first substrate W1 may sometimes be referred to as "upper wafer W1"; the second substrate W2, "lower wafer W2"; and the bonded substrate T, "bonded wafer T". In addition, hereinafter, among plate surfaces of the upper wafer W1, the plate surface to be bonded to the lower wafer W2 will be referred to as "bonding surface W1*j*", and the plate surface opposite to the bonding surface W1*j* will be referred to as "non-bonding surface W1*n*". Likewise, among plate surfaces of the lower wafer W2, the plate surface to be bonded to the upper wafer W1 will be referred to as "bonding surface W2*j*", and the plate surface opposite to the bonding surface W2*j* will be referred to as "non-bonding surface W2*n*".

As depicted in FIG. 1, the bonding apparatus 1 is equipped with a carry-in/out station 2 and a processing station 3 which are arranged in this order along the positive X-axis direction. The carry-in/out station 2 and the processing station 3 are connected as one body.

The carry-in/out station 2 includes a placing table 10 and a transfer section 20. The placing table 10 is equipped with a multiple number of placing plates 11. Provided on the placing plates 11 are cassettes CS1, CS2 and CS3 each of which accommodates therein a plurality of (e.g., 25 sheets of) substrates horizontally. The cassette CS1 accommodates therein upper wafers W1; the cassette CS2, lower wafers W2; and the cassettes CS3, bonded wafers T. Further, the upper wafers W1 and the lower wafers W2 are accommodated in the cassettes CS1 and the cassette CS2, respectively, with the bonding surfaces W1*j* and W2*j* facing upwards while being aligned in the same direction.

The transfer section 20 is provided adjacent to the positive X-axis side of the placing table 10, and is equipped with a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis, and serves to transfer the upper wafers W1, the lower wafers W2, and the bonded wafers T between the cassettes CS1 to CS3 placed on the placing table 10 and a third processing block PB3 of the processing station 3.

The processing station 3 has, for example, three processing blocks PB1, PB2, and PB3. The first processing block PB1 is provided on the rear side (positive Y-axis side of FIG. 1) of the processing station 3. The second processing block PB2 is provided on the front side (negative Y-axis side of FIG. 1) of the processing station 3. The third processing block PB3 is provided on the carry-in/out station 2 side (negative X-axis side of FIG. 1) of the processing station 3.

Further, the processing station 3 is equipped with a transfer section 60 having a transfer device 61 in a region surrounded by the first processing block PB1 to the third processing block PB3. For example, the transfer device 61 has a transfer arm configured to be movable in a vertical direction and a horizontal direction and pivotable around a vertical axis. The transfer device 61 is moved within the transfer section 60 to transfer the upper wafers W1, the lower wafers W2, and the bonded wafers T to devices within the first processing block PB1, the second processing block PB2, and the third processing block PB3 which are adjacent to the transfer section 60.

The first processing block PB1 includes, for example, a surface modifying apparatus 33 and a surface hydrophilizing apparatus 34. The surface modifying apparatus 33 is configured to modify the bonding surface W1*j* of the upper wafer W1 and the bonding surface W2*j* of the lower wafer W2. The surface hydrophilizing apparatus 34 is configured to hydrophilize the modified bonding surfaces W1*j* and W2*j* of the upper and lower wafers W1 and W2, respectively.

By way of example, the surfacy modifying apparatus 33 cuts a $SiO_2$ bond on the bonding surfaces W1*j* and W2*j* to form a dangling bond of Si, thus allowing the bonding surfaces W1*j* and W2*j* to be hydrophilized afterwards. The surface modifying apparatus 33 excites an oxygen gas as a processing gas into plasma under a decompressed atmosphere, for example. By radiating oxygen ions to the bonding surface W1*j* of the upper wafer W1 and the bonding surface W2*j* of the lower wafer W2, the surface modifying apparatus 33 plasma-processes the bonding surfaces W1*j* and W2*j* to modify them. The processing gas is not limited to the oxygen gas, but it may be a nitrogen gas or the like.

The surface hydrophilizing apparatus 34 is configured to hydrophilize the bonding surface W1*j* of the upper wafer W1 and the bonding surface W2*j* of the lower wafer W2 with, for example, a hydrophilizing liquid such as pure water. The surface hydrophilizing apparatus 34 also has a function of cleaning the bonding surfaces W1*j* and W2*j*. In this surface hydrophilizing apparatus 34, while rotating the upper wafer W1 or the lower wafer W2 held by, for example, a spin chuck, the pure water is supplied onto the upper wafer W1 or the lower wafer W2. Accordingly, the pure water is diffused on the bonding surfaces W1*j* and W2*j*, and an OH group is attached to the dangling bond of Si, so that the bonding surfaces W1*j* and W2*j* are hydrophilized.

As shown in FIG. 2, the second processing block PB2 includes, for example, a bonding module 41, a first temperature control device 42, and a second temperature control device 43. The bonding module 41 is configured to bond the hydrophilized upper wafer W1 and lower wafer W2 to produce the bonded wafer T. The first temperature control device 42 is configured to adjust a temperature distribution of the upper wafer W1 before producing the bonded wafer T. The second temperature control device 43 is configured to adjust a temperature distribution of the lower wafer W2 before producing the bonded wafer T. In addition, in the present exemplary embodiment, although the first temperature control device 42 and the second temperature control device 43 are provided separately from the bonding module 41, they may be provided as a part of the bonding module 41.

The third processing block PB3 is equipped with a first position adjusting device 51, a second position adjusting device 52, and transition devices 53 and 54 in this order from top to bottom, for example. Further, the places where the individual devices are disposed in the third processing block PB3 are not limited to the example shown in FIG. 2. The first position adjusting device 51 is configured to adjust a direction of the upper wafer W1 in a horizontal direction, and invert the upper wafer W1 upside down so that the bonding surface W1*j* of the upper wafer W1 faces downwards. The second position adjusting device 52 is configured to adjust a direction of the lower wafer W2 in a horizontal direction. The transition device 53 is configured to temporarily place therein the upper wafer W1. Further, the transition device 54 is configured to temporarily place therein the lower wafer W2 and the bonded wafer T.

Referring back to FIG. 1, the bonding apparatus 1 is equipped with a control device (controller) 90 configured to control the individual constituent components. The control device 90 is a control computer having one or more processors 91, a memory 92, a non-illustrated input/output interface, and an electronic circuit. The one or more processors 91 are implemented by one of a CPU, an ASIC, an FPGA, and a circuit composed of a plurality of discrete semiconductors, or a combination thereof, and execute programs stored in the memory 92. The memory 92 forms a storage of the control device 90, including a non-volatile memory and a volatile memory.

Figure 4:
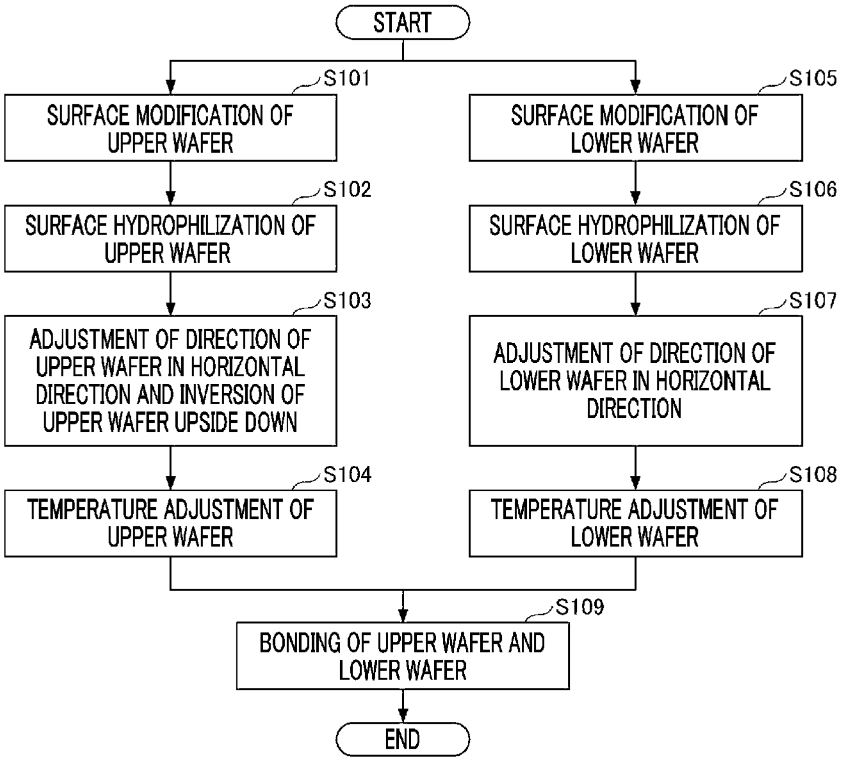
FIG. 4 is a flowchart illustrating a bonding method according to the first exemplary embodiment.

Now, referring to FIG. 4, a bonding method of the present exemplary embodiment will be explained. Processes S101 to S109 shown in FIG. 4 are performed under the control of the control device 90.

In the bonding method, an operator or a transfer robot (not shown) places the cassette CS1 accommodating therein the plurality of upper wafers W1, the cassette CS2 accommodating therein the plurality of lower wafers W2, and the empty cassette CS3 on the placing table 10 of the carry-in/out station 2.

The bonding apparatus 1 takes out the upper wafer W1 in the cassette CS1 by the transfer device 22, and transfers it to the transition device 53 of the third processing block PB3 of the processing station 3. Thereafter, the bonding apparatus 1 takes out the upper wafer W1 from the transition device 53 by the transfer device 61, and transfers it to the surface modifying apparatus 33 of the first processing block PB1.

Next, the bonding apparatus 1 modifies the bonding surface W1*j* of the upper wafer W1 by the surface modifying apparatus 33 (process S101). The surface modifying apparatus 33 modifies the bonding surface W1*j* in the state that the bonding surface W1*j* faces upwards. Then, the transfer device 61 takes out the upper wafer W1 from the surface modifying apparatus 33, and transfers it to the surface hydrophilizing apparatus 34.

Then, the bonding apparatus 1 hydrophilizes the bonding surface W1*j* of the upper wafer W1 by the surface hydrophilizing apparatus 34 (process S102). The surface hydrophilizing apparatus 34 hydrophilizes the bonding surface W1*j* in the state that the bonding surface W1*j* faces upwards. Thereafter, the transfer device 61 takes out the upper wafer W1 from the surface hydrophilizing apparatus 34, and transfers it to the first position adjusting device 51 of the third processing block PB3.

The bonding apparatus 1 adjusts the direction of the upper wafer W1 in the horizontal direction and inverts the upper wafer W1 upside down by the first position adjusting device 51 (process S103). As a result, a notch of the upper wafer W1 is directed in a predetermined direction, and the bonding surface W1*j* of the upper wafer W1 is turned to face downwards. Thereafter, the transfer device 61 takes out the upper wafer W1 from the first position adjusting device 51, and transfers it to the first temperature control device 42 of the second processing block PB2.

The bonding apparatus 1 adjusts the temperature of the upper wafer W1 by the first temperature control device 42 (process S104). The temperature adjustment of the upper wafer W1 is performed with the bonding surface W1*j* of the upper wafer W1 facing downwards. Thereafter, the transfer device 61 takes out the upper wafer W1 from the first temperature control device 42, and transfers it to the bonding module 41.

The bonding apparatus 1 performs a processing on the lower wafer W2 in parallel with the above-described processing on the upper wafer W1. First, the bonding apparatus 1 takes out the lower wafer W2 in the cassette CS2 by the transfer device 22, and transfers it to the transition device 54 of the third processing block PB3 of the processing station 3. Then, the transfer device 61 takes out the lower wafer W2 from the transition device 54, and transfers it to the surface modifying apparatus 33 of the first processing block PB1.

The bonding apparatus 1 modifies the bonding surface W2*j* of the lower wafer W2 by the surface modifying apparatus 33 (process S105). The surface modifying apparatus 33 modifies the bonding surface W2*j* in the state that the bonding surface W2*j* faces upwards. Thereafter, the transfer device 61 takes out the lower wafer W2 from the surface modifying apparatus 33, and transfers it to the surface hydrophilizing apparatus 34.

The bonding apparatus 1 hydrophilizes the bonding surface W2*j* of the lower wafer W2 by the surface hydrophilizing apparatus 34 (process S106). The surface hydrophilizing apparatus 34 hydrophilizes the bonding surface W2*j* in the state that the bonding surface W2*j* faces upwards. Then, the transfer device 61 takes out the lower wafer W2 from the surface hydrophilizing apparatus 34, and transfers it to the second position adjusting device 52 of the third processing block PB3.

The bonding apparatus 1 adjusts the direction of the lower wafer W2 in the horizontal direction by the second position adjusting device 52 (process S107). As a result, a notch of the lower wafer W2 is directed toward a predetermined direction. Thereafter, the transfer device 61 takes out the lower wafer W2 from the second position adjusting device 52, and transfers it to the second temperature control device 43 of the second processing block PB2.

The bonding apparatus 1 adjusts the temperature of the lower wafer W2 by the second temperature control device 43 (process S108). The temperature adjustment of the lower wafer W2 is performed with the bonding surface W2*j* of the lower wafer W2 facing upwards. Thereafter, the transfer device 61 takes out the lower wafer W2 from the second temperature control device 43, and transfers it to the bonding module 41.

Then, the bonding apparatus 1 bonds the upper wafer W1 and the lower wafer W2 in the bonding module 41 to produce the bonded wafer T (process S109). After the production of the bonded wafer T, the transfer device 61 takes out the bonded wafer T from the bonding module 41, and transfers it to the transition device 54 of the third processing block PB3.

Finally, the bonding apparatus 1 takes out the bonded wafer T from the transition device 54 by the transfer device 22, and transfers it to the cassette CS3 on the placing table 10. Thus, the series of processes are ended.

Figure 5:
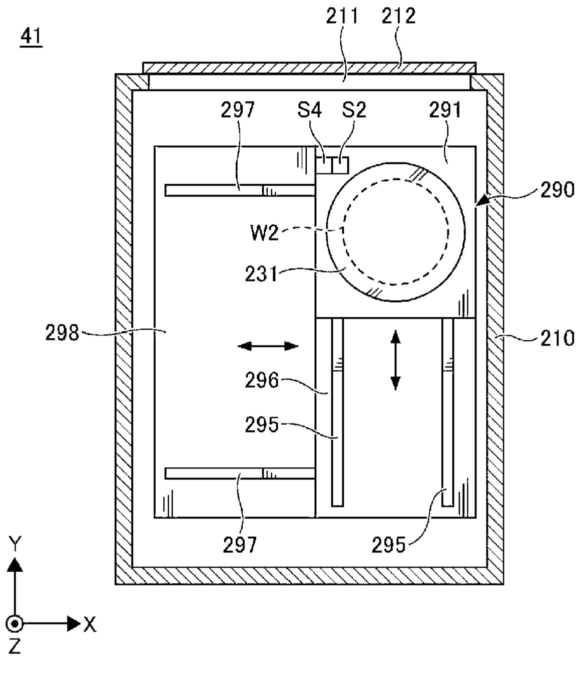
FIG. 5 is a plan view illustrating an example of a bonding module according to the first exemplary embodiment.

Now, with reference to FIG. 5 to FIG. 7, an example of the bonding module 41 will be described. As depicted in FIG. 5, the bonding module 41 is equipped with a processing vessel 210 having a sealable inside. A carry-in/out opening 211 is formed on a side surface of the processing vessel 210 on the transfer section 60 side, and an opening/closing shutter 212 is provided at the carry-in/out opening 211. The upper wafer W1, the lower wafer W2, and the bonded wafer T are carried in and out through the carry-in/out opening 211.

Figure 6:
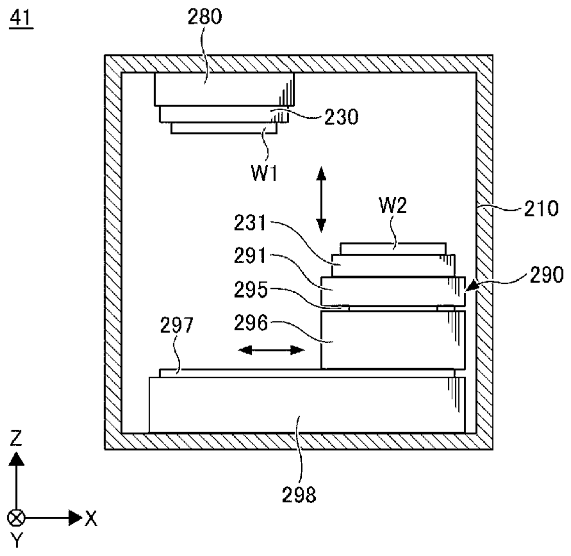
FIG. 6 is a side view of the bonding module of FIG. 5.

As shown in FIG. 6, an upper chuck 230 (first holder) and a lower chuck 231 (second holder) are provided inside the processing vessel 210. The upper chuck 230 holds the upper wafer W1 from above while allowing the bonding surface W1*j* of the upper wafer W1 to face downwards. Further, the lower chuck 231 is disposed below the upper chuck 230, and holds the lower wafer W2 from below while allowing the bonding surface W2*j* of the lower wafer W2 to face upwards.

The upper chuck 230 is supported by a supporting member 280 provided on a ceiling surface of the processing vessel 210. Meanwhile, the lower chuck 231 is supported by a first lower chuck mover 291 provided below the lower chuck 231, and can be disposed at a position facing the upper chuck 230.

The first lower chuck mover 291 moves the lower chuck 231 in a horizontal direction (Y-axis direction) as will be described later. Further, the first lower chuck mover 291 is configured to be capable of moving the lower chuck 231 in a vertical direction and rotating it around a vertical axis.

The first lower chuck mover 291 is mounted to a pair of rails 295 provided on a bottom surface side of the first lower chuck mover 291 and extending in the horizontal direction (Y-axis direction). The first lower chuck mover 291 is configured to be movable along the rails 295. The rails 295 are provided on the second lower chuck mover 296.

The second lower chuck mover 296 is mounted to a pair of rails 297 provided on a bottom surface side of the second lower chuck mover 296 and extending in a horizontal direction (X-axis direction). The second lower chuck mover 296 is configured to be movable along the rails 297. In addition, the pair of rails 297 are disposed on a placing table 298 which is provided on a bottom surface of the processing vessel 210.

The first lower chuck mover 291 and the second lower chuck mover 296 constitute a moving mechanism 290. The moving mechanism 290 moves the lower chuck 231 relative to the upper chuck 230. Further, the moving mechanism 290 moves the lower chuck 231 between a substrate delivery position and a bonding position.

The substrate delivery position is a position where the upper chuck 230 receives the upper wafer W1 from the transfer device 61, the lower chuck 231 receives the lower wafer W2 from the transfer device 61, and the lower chuck 231 delivers the bonded wafer T to the transfer device 61. The substrate delivery position is a position where a carry-out of the bonded wafer T produced by the $n^{th}$ (n is a natural number equal to or larger than 1) bonding and a carry-in of the upper wafer W1 and the lower wafer W2 to be bonded by the $(n+1)^{th}$ bonding are performed in succession. The substrate delivery position is, for example, a position shown in FIG. 5 and FIG. 6.

When handing the upper wafer W1 over to the upper chuck 230, the transfer device 61 advances to a space directly below the upper chuck 230. Further, when receiving the bonded wafer T from the lower chuck 231 and handing the lower wafer W2 over to the lower chuck 231, the transfer device 61 advances to a space directly above the lower chuck 231. The upper chuck 230 and the lower chuck 231 are placed sideways apart and a distance between the upper chuck 230 and the lower chuck 231 in a vertical direction is large so that the transfer device 61 advances therebetween easily.

Meanwhile, the bonding position is a position where the upper wafer W1 and the lower wafer W2 are made to face each other with a preset distance therebetween. The bonding position is, for example, a position shown in FIG. 7. At the bonding position, the distance between the upper wafer W1 and the lower wafer W2 in the vertical direction is narrower than that at the substrate delivery position. Further, at the bonding position, the upper wafer W1 and the lower wafer W2 overlap each other when viewed from the vertical direction, unlike at the substrate delivery position.

The moving mechanism 290 moves the relative positions of the upper chuck 230 and the lower chuck 231 in horizontal directions (both the X-axis direction and the Y-axis direction) and a vertical direction. Although the moving mechanism 290 moves the lower chuck 231 in the present exemplary embodiment, it may move any one of the lower chuck 231 and the upper chuck 230, or both of them. Further, the moving mechanism 290 may rotate the upper chuck 230 or the lower chuck 231 around a vertical axis.

Figure 7:
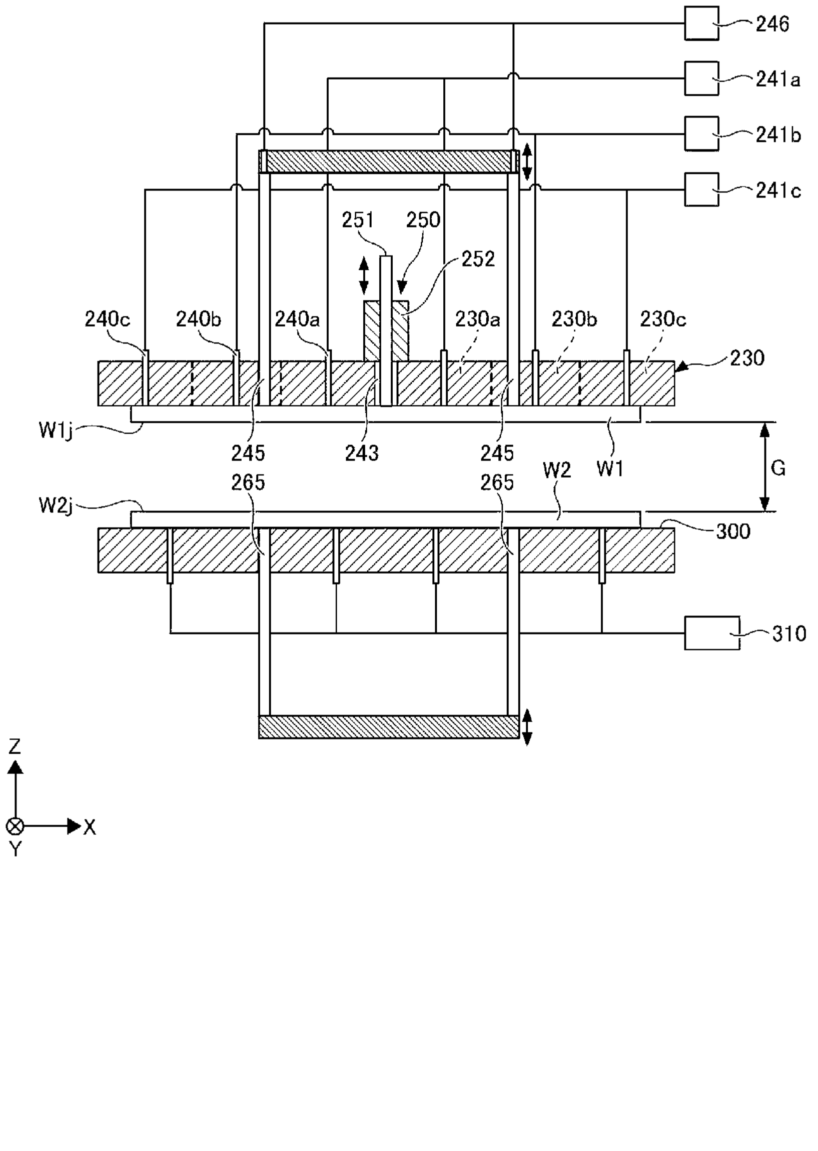
FIG. 7 is a cross sectional view illustrating an example of an upper chuck and a lower chuck.

As illustrated in FIG. 7, the upper chuck 230 is divided into a plurality of (for example, three) regions 230*a*, 230*b*, and 230*c* along a radial direction of the upper chuck 230. These regions 230*a*, 230*b*, and 230*c* are provided in this order from a center of the upper chuck 230 toward an outer periphery thereof. The region 230*a* is formed in a circular shape when viewed from the top, and the regions 230*b* and 230*c* are formed in an annular shape when viewed from the top. The regions 230*b* and 230*c* may have a plurality of arc-shaped zones (small regions) along a circumferential direction.

Suction lines 240*a*, 240*b*, and 240*c* are independently provided in the regions 230*a*, 230*b*, and 230*c*, respectively. Different vacuum pumps 241*a*, 241*b*, and 241*c* are connected to the suction lines 240*a*, 240*b*, and 240*c*, respectively. The upper chuck 230 is capable of vacuum-attracting the upper wafer W1 in each of the regions 230*a*, 230*b*, and 230*c* individually.

The upper chuck 230 is provided with a multiple number of holding pins 245 configured to be movable up and down in a vertical direction. The plurality of holding pins 245 are connected to a vacuum pump 246, and the upper wafer W1 is vacuum-attracted to the holding pins 235 by the operation of the vacuum pump 246. The upper wafer W1 is vacuum-attracted to lower ends of the plurality of holding pins 245. Instead of the plurality of holding pins 245, a ring-shaped attraction pad may be used.

The plurality of holding pins 245 are protruded from an attraction surface of the upper chuck 230 as they are lowered by a non-illustrated driving unit. In this state, the plurality of holding pins 245 receives the upper wafer W1 from the transfer device 61 by vacuum-attracting it. Thereafter, the plurality of holding pins 245 are raised, allowing the upper wafer W1 to come into contact with the attraction surface of the upper chuck 230. Then, the upper chuck 230 vacuum-attracts the upper wafer W1 horizontally in the respective regions 230*a*, 230*b*, and 230*c* by the operations of the vacuum pumps 241*a*, 241*b*, and 241*c*, respectively.

In addition, the upper chuck 230 has, at the center thereof, a through hole 243 formed through the upper chuck 230 in a vertical direction. A pushing member 250 is inserted through the through hole 243. The pushing member 250 presses the center of the upper wafer W1 spaced apart from the lower wafer W2, thus bringing the upper wafer W1 into contact with the lower wafer W2.

The pushing member 250 has a pushing pin 251 and an outer cylinder 252 serving as an elevation guide for the pushing pin 251. The pushing pin 251 is inserted through the through hole 243 by, for example, a driving unit (not shown) having a motor therein, and is protruded from the attraction surface of the upper chuck 230, pressing the center of the upper wafer W1.

Moreover, the lower chuck 231 also has a plurality of partitioned regions in an attraction surface 300 for attracting the lower wafer W2. The configuration of the attraction surface 300 of the lower chuck 231 will be described in detail later.

The lower chuck 231 is provided with a plurality of (for example, three) holding pins 265 configured to be movable up and down in a vertical direction. The lower wafer W2 is placed on upper ends of the plurality of holding pins 265. Further, the lower wafer W2 may be vacuum-attracted to the upper ends of the plurality of holding pins 265.

The plurality of holding pins 265 are protruded from the attraction surface 300 of the lower chuck 231 as they are raised. In this state, the plurality of holding pins 265 receive the lower wafer W2 from the transfer device 61. After that, the plurality of holding pins 265 are lowered, thus allowing the lower wafer W2 to come into contact with the attraction surface 300 of the lower chuck 231. Then, the lower chuck 231 vacuum-attracts the lower wafer W2 horizontally in the plurality of regions of the attraction surface 300.

Figure 8:
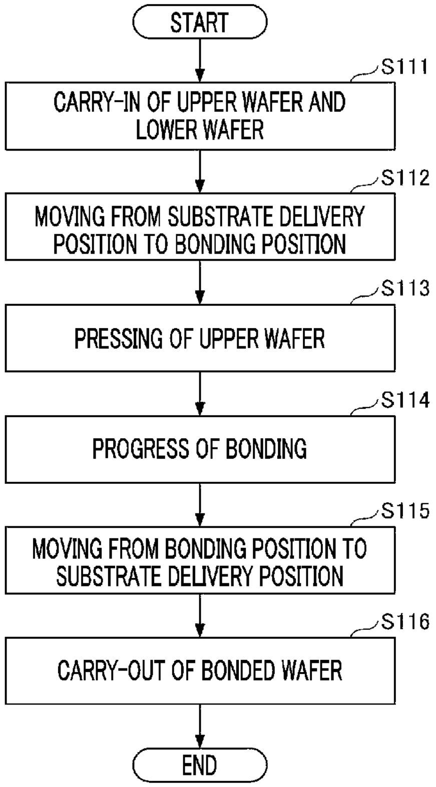
FIG. 8 is a flowchart illustrating details of a process S109 of FIG. 4.

Now, with reference to FIG. 8 to FIG. 10C, the process of manufacturing the bonded wafer T in the process S109 of FIG. 4 will be described in detail. As depicted in FIG. 8, the control device 90 controls the transfer device 61 to carry the upper wafer W1 and the lower wafer W2 into the bonding module 41 (process S111). The relative positions of the upper chuck 230 and the lower chuck 231 after being carried in are as shown in FIG. 5 and FIG. 6, that is, they are at the substrate delivery position.

After the carry-in, the control device 90 controls the moving mechanism 290 to move the relative positions of the upper chuck 230 and the lower chuck 231 from the substrate delivery position to the bonding position shown in FIG. 7 (process S112). In this process S112, the control device 90 carries out alignment between the upper wafer W1 and the lower wafer W2 by using an upper camera S1 and a lower camera S2 as shown in FIG. 9A to FIG. 9C.

The upper camera S1 is fixed to the upper chuck 230 to image the lower wafer W2 held by the lower chuck 231. Multiple reference points P21 to P23 are previously formed on the bonding surface W2*j* of the lower wafer W2. As the reference points P21 to P23, patterns of electronic circuits or the like may be used. The number of the reference points is not particularly limited.

Meanwhile, the lower camera S2 is fixed to the lower chuck 231 to image the upper wafer W1 held by the upper chuck 230. Multiple reference points P11 to P13 are formed in advance on the bonding surface W1*j* of the upper wafer W1. As the reference points P11 to P13, patterns of electronic circuits or the like may be used. The number of these reference points is not particularly limited.

Figure 9A:
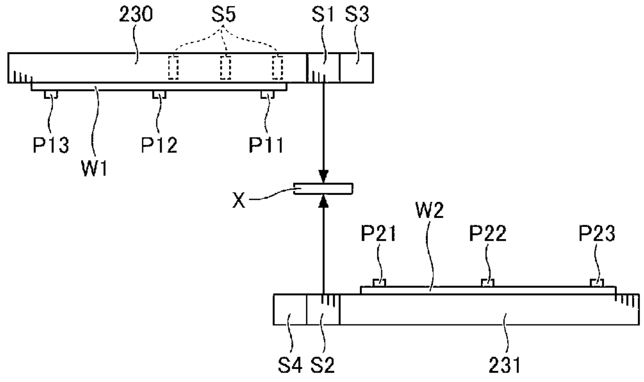
FIG. 9A is a side view illustrating an example of an operation in a process S112 of FIG. 8.
Figure 9B:
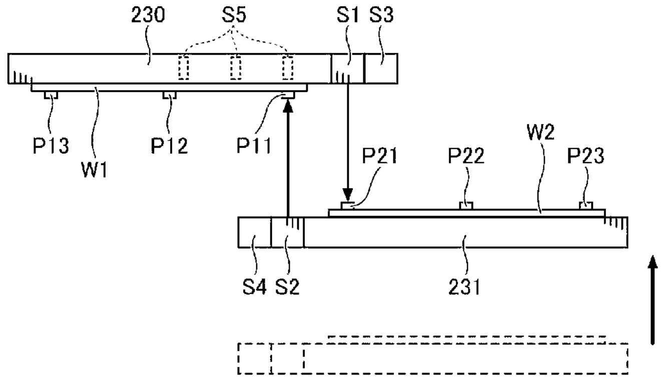
FIG. 9B is a side view illustrating an operation following that of FIG. 9A.
Figure 9C:
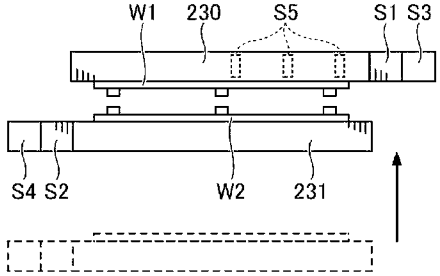
FIG. 9C is a side view illustrating an operation following that of FIG. 9B.

As depicted in FIG. 9A, the bonding module 41 adjusts the relative positions of upper camera S1 and lower camera S2 in a horizontal direction through the use of the moving mechanism 290. Specifically, the moving mechanism 290 moves the lower chuck 231 in the horizontal direction such that the lower camera S2 is positioned substantially directly below the upper camera S1. Then, the upper camera S1 and the lower camera S2 image a common target X and the moving mechanism 290 finely adjusts the position of the lower camera S2 in the horizontal direction such that the positions of the upper camera S1 and the lower camera S2 in the horizontal direction are coincident.

Subsequently, as shown in FIG. 9B, the moving mechanism 290 moves the lower chuck 231 vertically upwards to adjust the positions of the upper chuck 230 and the lower chuck 231 in the horizontal direction. Specifically, while the moving mechanism 290 is moving the lower chuck 231 in the horizontal direction, the upper camera S1 sequentially images the reference points P21 to P23 of the lower wafer W2, and the lower camera S2 sequentially images the reference points P11 to P13 of the upper wafer W1. FIG. 9B shows a state in which the upper camera S1 is imaging the reference point P21 of the lower wafer W2 and the lower camera S2 is imaging the reference point P11 of the upper wafer W1.

The upper camera S1 and the lower camera S2 transmit the obtained image data to the control device 90. The control device 90 controls the moving mechanism 290 based on the image data obtained by the upper camera S1 and the image data obtained by the lower camera S2, and adjusts the position of the lower chuck 231 in the horizontal direction such that the reference points P11 to P13 of the upper wafer W1 and the reference points P21 to P23 of the lower wafer W2 coincide with each other when viewed from the vertical direction.

Thereafter, as illustrated in FIG. 9C, the moving mechanism 290 moves the lower chuck 231 vertically upwards. As a result, a distance G (see FIG. 7) between the bonding surface W2*j* of the lower wafer W2 and the bonding surface W1*j* of the upper wafer W1 becomes a predetermined distance of, e.g., 80 μm to 200 μm. The adjustment of the distance G is performed by using a first displacement meter S3 and a second displacement meter S4.

The first displacement meter S3 is fixed to the upper chuck 230, and measures the thickness of the lower wafer W2 held by the lower chuck 231. The first displacement meter S3 measures the thickness of the lower wafer W2 by, for example, radiating light to the lower wafer W2 and receiving reflected light reflected from both top and bottom surfaces of the lower wafer W2. This thickness measurement is performed when the moving mechanism 290 moves the lower chuck 231 in the horizontal direction, for example. The first displacement meter S3 carries out the measurement by, for example, a confocal method, a spectral interference method, or a triangulation method. A light source of the first displacement meter S3 is an LED or a laser.

Meanwhile, the second displacement meter S4 is fixed to the lower chuck 231, and measures the thickness of the upper wafer W1 held by the upper chuck 230. The second displacement meter S4 measures the thickness of the upper wafer W1 by, for example, radiating light to the upper wafer W1 and receiving reflected light reflected from both top and bottom surfaces of the upper wafer W1. This thickness measurement is performed when the moving mechanism 290 moves the lower chuck 231 in the horizontal direction, for example. The second displacement meter S4 carries out the measurement by, for example, a confocal method, a spectral interference method, or a triangulation method. A light source of the second displacement meter S4 is an LED or a laser.

The first displacement meter S3 and the second displacement meter S4 transmit the measured data to the control device 90. The control device 90 controls the moving mechanism 290 based on the data obtained by the first displacement meter S3 and the data obtained by the second displacement meter S4, and adjusts the position of the lower chuck 231 in the vertical direction such that the distance G becomes the set value.

Figure 10A:
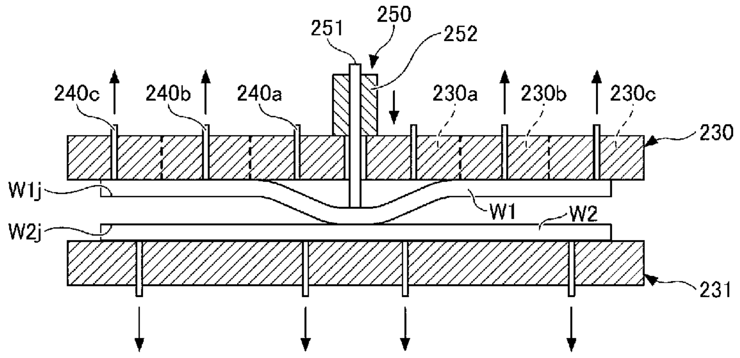
FIG. 10A is a cross sectional view illustrating an example of an operation in a process S113 of FIG. 8.

Next, the operation of the vacuum pump 241*a* is stopped. As a result, as shown in FIG. 10A, the vacuum attraction of the upper wafer W1 in the region 230*a* is canceled. Thereafter, the pushing pin 251 of the pushing member 250 is lowered to press the center of the upper wafer W1, allowing the upper wafer W1 to come into contact with the lower wafer W2 (process S113 in FIG. 8). As a result, the centers of the upper and lower wafers W1 and W2 are bonded to each other.

Since the bonding surface W1*j* of the upper wafer W1 and the bonding surface W2*j* of the lower wafer W2 are modified, a van der Waals force (intermolecular force) is first generated between the bonding surfaces W1*j* and W2*j*, so that the bonding surfaces W1*j* and W2*j* are bonded to each other. Further, since the bonding surface W1*j* of the upper wafer W1 and the bonding surface W2*j* of the lower wafer W2 have been hydrophilized, hydrophilic groups (e.g., OH groups) are hydrogen-bonded, allowing the bonding surfaces W1*j* and W2*j* to be firmly bonded to each other.

Figure 10B:
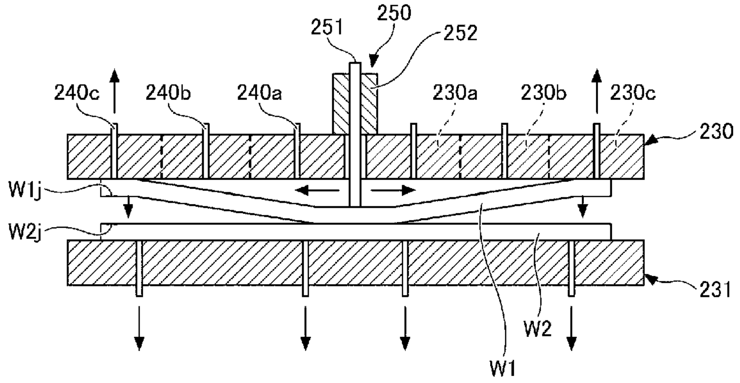
FIG. 10B is a cross sectional view illustrating an example of an operation in a process S114 of FIG. 8.
Figure 10C:
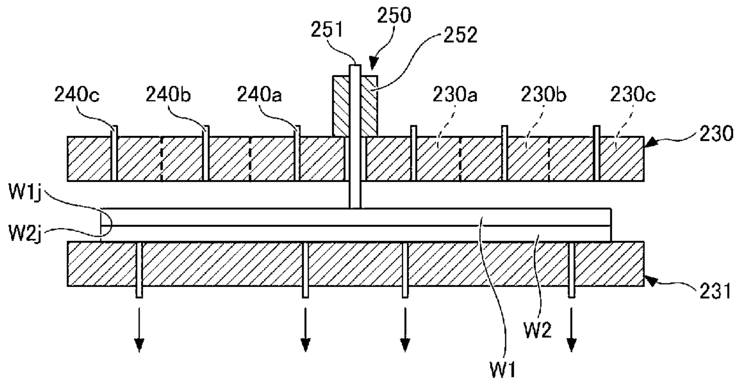
FIG. 10C is a cross sectional view illustrating an operation following that of FIG. 10B.

Subsequently, the control device 90 stops the operation of the vacuum pump 241*b*, and cancels the vacuum attraction of the upper wafer W1 in the region 230*b*, as shown in FIG. 10B. Afterwards, the control device 90 stops the operation of the vacuum pump 241*c*, and cancels the vacuum attraction of the upper wafer W1 in the region 230*c*, as shown in FIG. 10C.

In this way, the vacuum attraction of the upper wafer W1 is released step by step from the center toward a periphery of the upper wafer W1, so that the upper wafer W1 drops and comes into contact with the lower wafer W2 step by step. Then, the bonding of the upper wafer W1 and the lower wafer W2 proceeds sequentially toward the peripheries of the upper and lower wafers W1 and W2 after the centers thereof are bonded (process S114). As a result, the entire bonding surface W1*j* of the upper wafer W1 and the entire bonding surface W2*j* of the lower wafer W2 come into contact with each other, so that the upper wafer W1 and the lower wafer W2 are bonded together, and the bonded wafer T is obtained. Then, the bonding apparatus 1 raises the pushing pin 251 to its original position.

After the bonded wafer T is formed, the control device 90 controls the moving mechanism 290 to move the relative positions of the upper chuck 230 and the lower chuck 231 from the bonding positions shown in FIG. 7 to the substrate delivery positions shown in FIG. 5 and FIG. 6 (process S115). By way of example, the moving mechanism 290 first lowers the lower chuck 231 to widen the distance between the lower chuck 231 and the upper chuck 230 in the vertical direction. Then, the moving mechanism 290 moves the lower chuck 231 sideways so that the lower chuck 231 and the upper chuck 230 are placed sideways apart.

Thereafter, the control device 90 controls the transfer device 61 to carry out the bonded wafer T from the bonding module 41 (process S116). Specifically, the lower chuck 231 first releases the holding of the bonded wafer T. Then, the plurality of holding pins 265 are raised to hand the bonded wafer T over to the transfer device 61. Thereafter, the plurality of holding pins 265 are lowered to their original positions.

Figure 11:
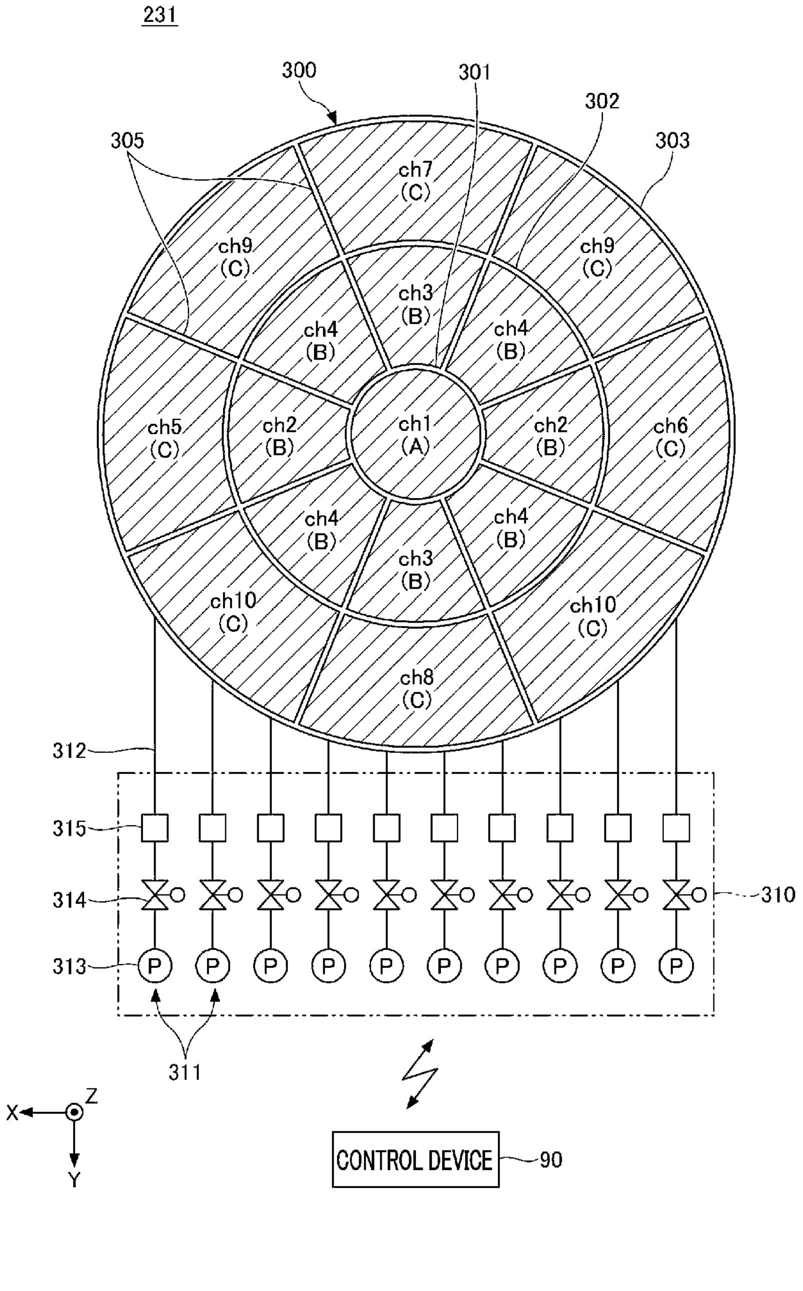
FIG. 11 is a plan view illustrating an example of an attraction surface of the lower chuck.

Now, the configuration of the attraction surface 300 of the lower chuck 231 will be described with reference to FIG. 11. This technique of the present disclosure is also applicable to the attraction surface of the upper chuck 230. In FIG. 11, hatched regions are regions in which an attracting pressure is generated. The attraction surface 300 of the lower chuck 231 has the plurality of regions that generate the attracting pressure individually.

For example, the attraction surface 300 is partitioned into a central region A, an intermediate region B, and an outer region C by annular ribs 301, 302, and 303. The central region A, the intermediate region B, and the outer region C are arranged concentrically in this order from a center of the attraction surface 300 toward an outer periphery thereof. Specifically, the central region A is formed in a circle shape. The intermediate region B is formed in an annular shape at a position outside and adjacent to the central region A. The outer region C is formed in an annular shape at a position outside and adjacent to the intermediate region B. Alternatively, the attraction surface 300 may not include the intermediate region B, and the outer region C may be positioned outside the central region A to be adjacent thereto. Still alternatively, the attraction surface 300 may include a plurality of annular intermediate regions B between the central region A and the outer region C.

The intermediate region B is divided into eight arc-shaped zones (small intermediate regions) by a plurality of ribs 305 that are arranged radially. Likewise, the outer region C is also divided into eight arc-shaped zones (small outer regions) by the ribs 305. Here, the number of the divisions of the intermediate region B may be equal to or different from the number of the divisions of the outer region C.

The central region A, the eight zones of the intermediate region B, and the eight zones of the outer region C are configured to be capable of suctioning the lower wafer W2 individually. Here, however, in the lower chuck 231 according to the present exemplary embodiment, ten suction mechanisms 311 are connected to the total of seventeen zones, and the attraction surface 300 are suctioned for the zones of ten channels. That is, the attraction surface 300 has, among the total of seventeen zones, zones in which the suctioning is performed by the same suction mechanism 311.

In detail, the central region A is connected to the suction mechanism 311 set for a single zone ch1. Meanwhile, in the intermediate region B, three zones ch2 to ch4 are set. The two zones adjacent to each other in the X-axis direction (a left-and-right direction in FIG. 11) with the central region A therebetween are the zones ch2. The two zones adjacent to each other in the Y-axis direction (an up-and-down direction in FIG. 11) with the central region A therebetween are the zones ch3. Further, in the intermediate region B, the four zones interposed between the zones ch2 and the zones ch3 are the zones ch4. Meanwhile, in the outer region C, six zones ch5 to ch10 are set. The one zone adjacent to the intermediate region B in the positive X-axis direction (left side in FIG. 11) is the zone ch5. The one zone adjacent to the intermediate region B in the negative X-axis direction (right side in FIG. 11) is the zone ch6. The one zone adjacent to the intermediate region B in the negative Y-axis direction (upper side in FIG. 11) is the zone ch7. The one zone adjacent to the intermediate region B in the positive Y-axis direction (bottom side in FIG. 11) is the zone ch8. Further, in the outer region C, the zone interposed between the zone ch5 and the zone ch7 and the zone interposed between the zone ch6 and the zone ch7 are the zones ch9. Likewise, in the outer region C, the zone interposed between the zone ch5 and the zone ch8 and the zone interposed between the zone ch6 and the zone ch8 are the zones ch10.

On the X-axis passing through the center of the attraction surface 300, the zones of ch5, ch2, ch1, ch2, and ch6 are arranged in this sequence from the positive X-axis side toward the negative X-axis side. On the Y-axis passing through the center of the attraction surface 300, the zones of ch7, ch3, ch1, ch3, and ch8 are arranged in this sequence from the negative Y-axis side toward the positive Y-axis side. Here, however, it should be noted that the attraction surface 300 can be designed as required for the number and the location of the channels of the respective zones without being limited to the shown example.

The bonding module 41 is equipped with an attracting pressure generator 310 configured to generate an attracting pressure in the respective zones of the ten channels of the attraction surface 300 individually. The suction mechanisms 311 of the attracting pressure generator 310 have suction lines 312 connected to the predetermined zones, and a suction pump 313, an opening/closing valve 314 and a pressure controller 315 are provided on each of these suction lines 312. The attracting pressure generator 310 is connected to the control device 90 so as to communicate with it, and operates the respective suction mechanisms 311 under the control of the control device 90.

Each suction mechanism 311 opens the opening/closing valve 314 by operating the suction pump 313 of the suction line 312, thus generating an attracting pressure (negative pressure) in the zone to which the suction line 312 is connected. The magnitude of the attracting pressure is controlled by the pressure controller 315. Further, each suction mechanism 311 releases the attracting pressure of the zone by closing the opening/closing valve 314 of the suction line 312 and introducing air through the pressure controller 315.

The lower chuck 231 configured as described above is capable of applying the attracting pressure to the non-bonding surface W2*n* of the lower wafer W2 in the respective zones of ch1 to ch10. For example, in the lower chuck 231, one or more channels among the zones of ch1 to ch10 may be set to have a first attracting pressure, while the other one or more channels may be set to have a second attracting pressure different from the first attracting pressure. Further, in the lower chuck 231, the attracting pressures in the zones of ch1 to ch10 may be set to be all different from each other.

Figure 12B:
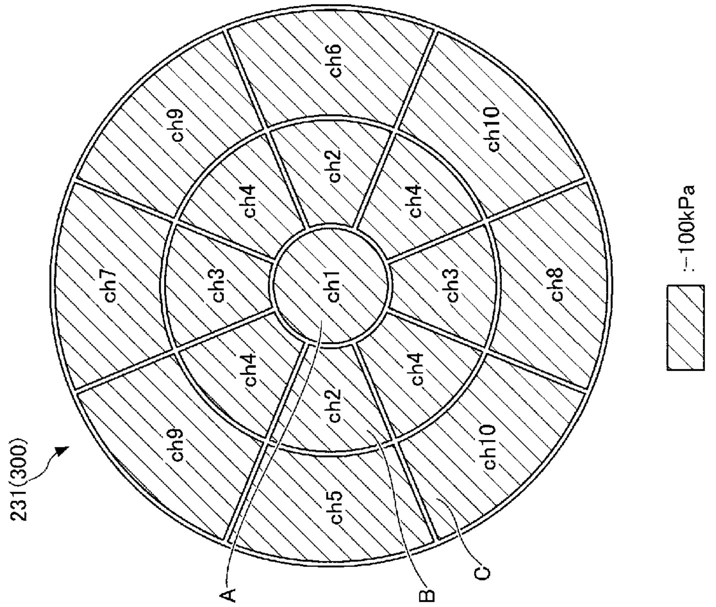
FIG. 12B is a plan view showing an attracting pressure distribution when the bonding progresses.
Figure 12A:
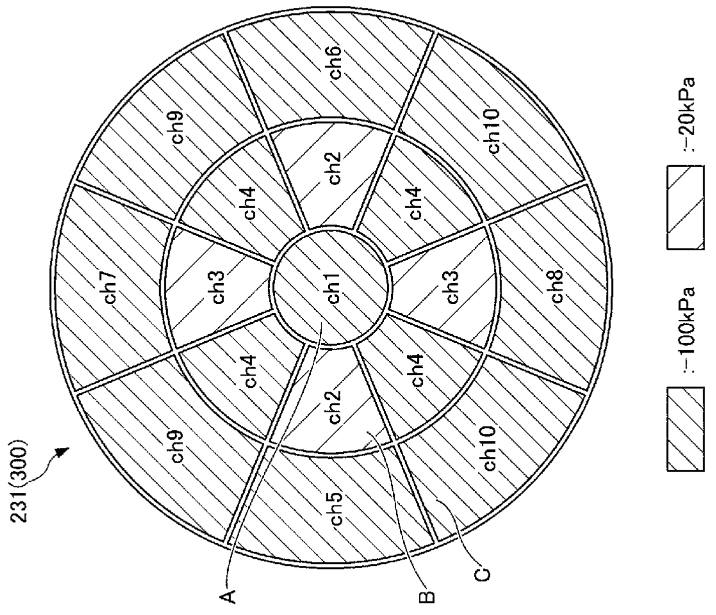
FIG. 12A is a plan view showing an attracting pressure distribution when bonding is begun.

As an example, the bonding apparatus 1 sets the attracting pressures of the respective zones of the attraction surface 300 to be of values shown in FIG. 12A before the pressurization of the upper wafer W1 by the pushing member 250 (before the bonding) and after the start of the pressurization (after the beginning of the bonding of the upper wafer W1 and the lower wafer W2). In detail, the zones of 1*ch* and 4*ch* to 10*ch* are set to the first attracting pressure of −100 kPa, and the zones of ch2 and ch3 are set to the second attracting pressure of −20 kPa. The attracting pressure is expressed as a negative pressure based on an atmospheric pressure. The smaller the negative pressure (the larger the absolute value of the negative pressure) is, the stronger the attracting pressure may be, and the larger the negative pressure (the smaller the absolute value of the negative pressure) is, the weaker the attracting pressure may be. Hereinafter, a distribution of the attracting pressures (the first attracting pressure and the second attracting pressure) of the respective zones of the attraction surface 300 at the beginning of the bonding will be referred to as a "beginning attracting pressure distribution".

In this way, by setting the attracting pressures of the zones ch2 and ch3, which are the zones of the intermediate region B in the X-axis direction and the Y-axis direction, to be weaker than the attracting pressures of the other zones, the lower wafer W2 is weakly fixed near the center thereof. For this reason, the lower wafer W2 is easily moved under the influence of the bonding force with the upper wafer W1, so it is smoothly bonded to the upper wafer W1.

If, however, the second attracting pressure weaker than the first attracting pressure is continuously applied to the zones of ch2 and ch3, distortion of the lower wafer W2 tends to occur easily due to a difference in the attracting pressure between these zones and the other zones. In particular, in the bonding of the upper wafer W1 and the lower wafer W2, when the bonding progresses from the centers toward the outer peripheries of the wafers, the distortion tends to easily occur at the outer peripheral side of the lower wafer W2.

To solve the problem, the bonding apparatus 1 according to the present exemplary embodiment adopts a configuration in which the pressure distribution of the respective zones of the attraction surface 300 is changed to a pressure distribution different from the beginning attracting pressure distribution when the bonding progresses. Hereinafter, the pressure distribution of the attraction surface 300 changed when the bonding progresses will be referred to as a "progress attracting pressure distribution". For example, in the progress attracting pressure distribution, the zones of 2*ch* and 3*ch*, which are set to have the second attracting pressure (−20 kPa) at the beginning of the bonding, are changed to have the first attracting pressure (−100 kPa), as illustrated in FIG. 12B. Therefore, the attracting pressures of the respective zones of 1*ch* to 10*ch* of the attraction surface 300 are equalized to −100 kPa.

In this way, in the bonding apparatus 1, by increasing the attracting pressures of the zones of 2*ch* and 3*ch* during the bonding, the vicinity of the outer periphery of the lower wafer W2 is strongly fixed when the bonding progresses. As a result, the distortion that may occur in the vicinity of the outer periphery of the lower chuck 231 can be suppressed, so that the upper wafer W1 and the lower wafer W2 can be bonded with high precision.

Hereinafter, a bonding method by the bonding module 41 and a configuration according to the bonding method will be described in detail. As described above, in the bonding apparatus 1, the upper wafer W1 is delivered on the plurality of holding pins 245 by the transfer device 61, and the upper wafer W1 is held by being attracted to the upper chuck 230 (upper wafer holding process: see FIG. 6 as well). Further, in the bonding apparatus 1, the lower wafer W2 delivered from the transfer device 61 onto the plurality of holding pins 265 is lowered, and attracted to the attraction surface 300 of the lower chuck 231 (lower wafer holding process). Thereafter, the lower chuck 231 is moved to the bonding position by the moving mechanism 290 (see FIG. 7). After the lower chuck 231 is placed at the bonding position, the control device 90 adjusts the attracting pressures of the attraction surface 300 of the lower chuck 231 to the beginning attracting pressure distribution, as shown in FIG. 12A. Accordingly, the attracting pressure generator 310 performs the attraction by setting the attracting pressures of the respective zones of ch1 and ch4 to ch10 to the first attracting pressure (−100 kPa) while setting the attracting pressures of the zones of ch2 and ch3 to the second attracting pressure (−20 kPa). In addition, the adjustment to the beginning attracting pressure distribution may be performed when the lower chuck 231 is moved, for example.

Thereafter, the bonding apparatus 1 begins a bonding process between the upper wafer W1 and the lower wafer W2. At the beginning of the bonding between the upper wafer W1 and the lower wafer W2, the control device 90 releases the vacuum attraction of the region 230*a* of the upper chuck 230, and presses the pushing member 250 onto the center of the upper wafer W1 with the pushing pin 251, as stated above (see FIG. 10A as well). Further, upon the lapse of a predetermined time, the control device 90 releases the vacuum attraction of the region 230*b* of the upper chuck 230 (see FIG. 10B).

Figure 13A:
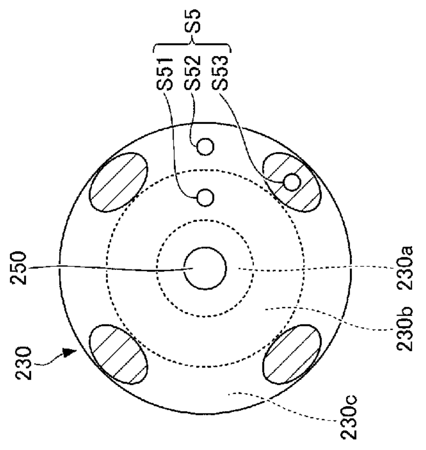
FIG. 13A is a plan view illustrating a layout of upper displacement sensors of the upper chuck.

Here, as shown in FIG. 13A, when the upper wafer W1 and the lower wafer W2 are bonded, the bonding apparatus 1 monitors the position of the upper wafer W1 with a plurality of upper displacement sensors S5 provided in the upper chuck 230. The plurality of upper displacement sensors S5 may include a first sensor S51 disposed in the region 230*b* in the X-axis direction, a second sensor S52 disposed in the region 230*c* in the X-axis direction, and a third sensor S53 disposed in the region 230*c* in the diagonal direction between the X-axis direction and the Y-axis direction. The number and the layout of the upper displacement sensors S5 are not limited to the shown example. By way of example, a plurality of sensors may be provided near the pushing member 250 (at the center of the upper chuck 230) or on the Y-axis side thereof.

Figure 13B:
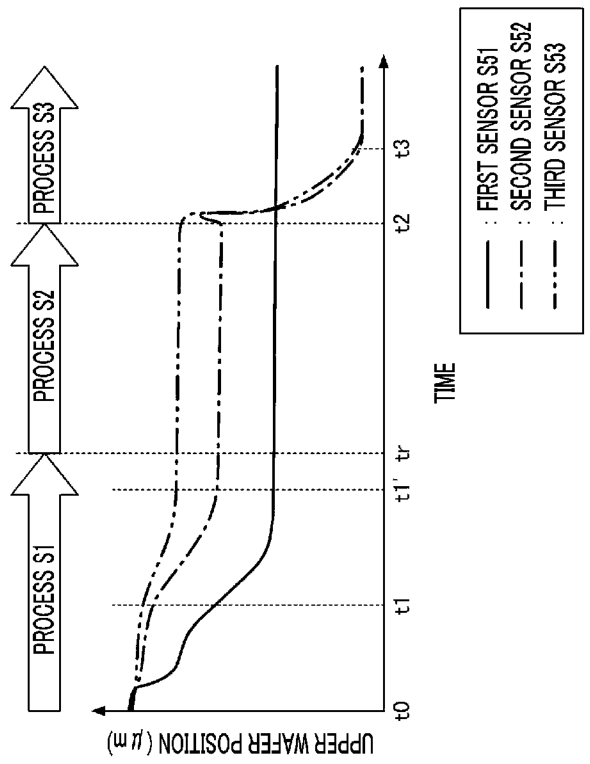
FIG. 13B is a graph showing displacements of the upper wafer by the upper displacement sensors and a variation of the attracting pressure distribution.

The first sensor S51, the second sensor S52, and the third sensor S53 are configured to measure a position (displacement) of the non-bonding surface W1*n* of the upper wafer W1 during the progress of the bonding, and transmits information of measurement results to the control device 90. Accordingly, the control device 90 acquires detection values of the respective sensors, as shown in a graph of FIG. 13B. In the graph of FIG. 13B, a horizontal axis represents time, and a vertical axis indicates the position of the upper wafer W1.

A time point t0 in the graph is a timing when the pressurization on the center of the upper wafer W1 by the pushing member 250 is begun (the beginning point of the bonding). After the time point to, the first sensor S51 detects the position of the non-bonding surface W1*n* as the center of the upper wafer W1 is lowered. At this time, the first sensor S51 detects the position of the upper wafer W1 which is rapidly lowered from the time point t0. Then, upon the lapse of time from a time point t1 at which the attraction of the region 230*b* is released, a portion of the upper wafer W1 near the position detected by the first sensor S51 comes into contact with the lower wafer W2. Therefore, the first sensor S51 outputs a substantially constant detection value.

Meanwhile, a detection value of the second sensor S52 located at the outer side than the first sensor S51 in the X-axis direction gradually decreases at a value (position) higher than the detection value of the first sensor S51 after the time point t0. Then, the detection value of the second sensor S52 becomes substantially constant from a time point t1' after a certain time further elapses from the time point t1 at which the attraction of the region 230*b* is released. That is, when the bonding between the upper wafer W1 and the lower wafer W2 progresses from the centers toward the outer peripheries thereof, a deformation (lowering) of the upper wafer W1 is temporarily stopped as the outer periphery of the upper wafer W1 is attracted to the region 230*c* of the upper chuck 230.

At the time point t2 upon the lapse of a certain time after the deformation of the upper wafer W1 is temporarily stopped, the control device 90 releases the attraction of the region 230*c*. Accordingly, the second sensor S52 outputs a detection value indicating that the upper wafer W1 is rapidly lowered immediately after the time point t2. Then, a time point t3 slightly after the time point t2 becomes a contact end point at which the entire bonding surface W1*j* of the upper wafer W1 and the entire bonding surface W2*j* of the lower wafer W2 finally come into contact with each other.

Moreover, a detection value of the third sensor S53 provided in the diagonal direction also falls gradually at a value (position) higher than the detection value of the second sensor S52 after the bonding begins. Here, in the region 230*c* of the upper chuck 230 according to the present exemplary embodiment, the upper wafer W1 is attracted at four places (indicated by hatching in FIG. 13A) in the diagonal direction. The third sensor S53, which is provided in the same region 230*c* as the second sensor S52, detects the displacement of the upper wafer W1 strongly attracted by the upper chuck 230. Thus, even if the third sensor S53 performs the detection at the same timing as the second sensor S52, the detection value of the third sensor S53 becomes higher than the detection value of the second sensor S52. Then, the detection value of the third sensor S53 also becomes substantially constant at the time point t1' after the certain time further elapses from the time point t1.

The control device 90 switches the attracting pressure distribution of the attraction surface 300 of the lower chuck 231 from the beginning attracting pressure distribution to the progress attracting pressure distribution after the time point t1' at which the detection value of the second sensor S52 and the detection value of the third sensor S53 become substantially constant. Below, a timing at which this switching is performed is referred to as a "switching time point tr".

In a process S1 prior to the switching time point tr, the lower chuck 231 attracts the lower wafer W2 with the aforementioned beginning attracting pressure distribution. Then, after the switching time point tr, the control device 90 performs a process S2 in which the attracting pressure distribution is switched to the progress attracting pressure distribution. In the progress attracting pressure distribution, the attracting pressures of all the channels are set to −100 kPa, as depicted in FIG. 12B. Accordingly, the lower chuck 231 firmly fixes the lower wafer W2 from its middle portion in a radial direction to the vicinity of the outer periphery thereof.

Further, even in a process S3 after the time point t2 at which the attraction of the region 230*c* is released, the lower chuck 231 maintains the progress attracting pressure distribution, so that the lower wafer W2 can be strongly fixed continuously. As a result, the lower chuck 231 enables the outer periphery of the upper wafer W1 and the outer periphery of the lower wafer W2 to be bonded with high precision.

The aforementioned change in the attracting pressure distribution during the progress of the bonding will be described in more detail with reference to FIG. 14A to FIG. 15B. At the beginning (time point t0 in FIG. 13B) of the bonding shown in FIG. 14A, the control device 90 attracts the lower wafer W2 with the beginning attracting pressure distribution. That is, the attraction surface 300 of the lower chuck 231 attracts the lower wafer W2 at −100 kPa in the zones of ch1 and ch4 to ch10, and attracts the lower wafer W2 at −20 kPa in the zones of ch2 and ch3.

When the attraction of the region 230*b* of the upper chuck 230 is released and the time point t1' is reached (see FIG. 13B), the lowering of the upper wafer W1, that is, the progress of the bonding between the upper wafer W1 and the lower wafer W2 is temporarily stopped as the region 230*c* is attracting the upper wafer W1. Specifically, as shown in FIG. 14B, at a position in the middle of the intermediate region B, the bonding of the upper wafer W1 and the lower wafer W2 is stopped.

Figure 14A:
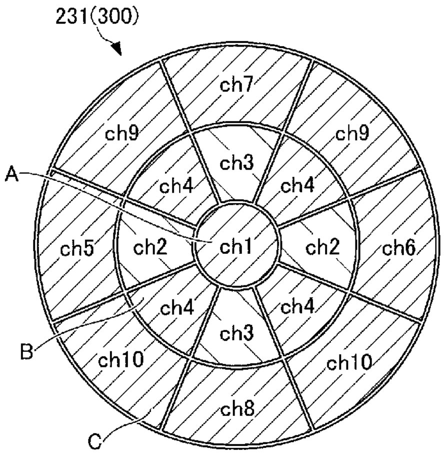
FIG. 14A is a plan view showing an attracting pressure distribution when bonding is begun.
Figure 14B:
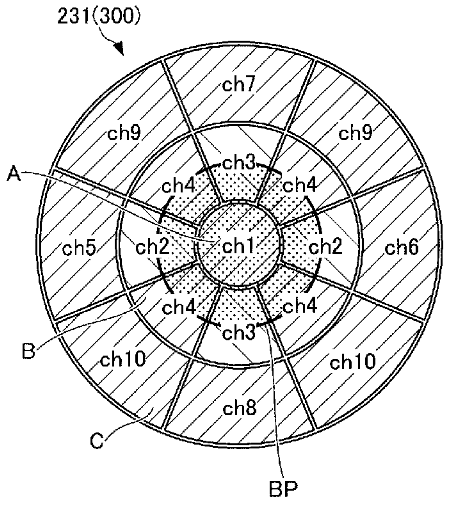
FIG. 14B is a plan view illustrating a state in which a progress of the bonding is temporarily stopped.
Figure 15A:
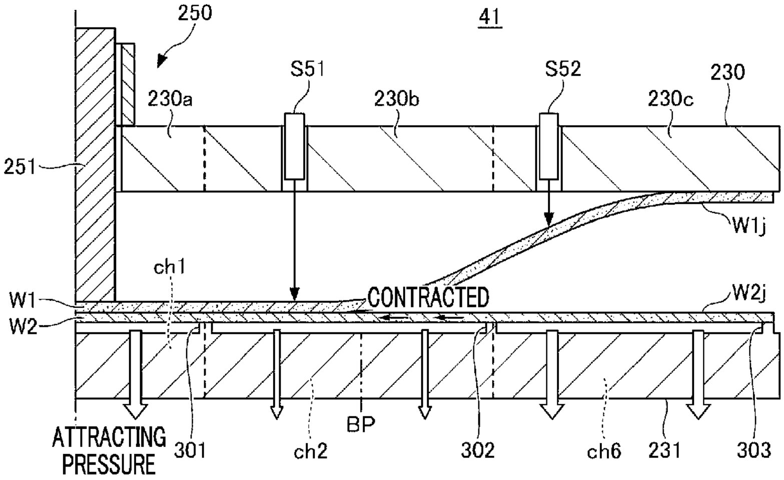
FIG. 15A is a cross sectional view illustrating a state in which a progress of bonding between an upper wafer and the lower wafer is temporarily stopped.

When the progress of the bonding is temporarily stopped, there is formed a boundary point BP (inflection point) at which a bonding portion on the center sides of the upper wafer W1 and lower wafer W2 and a separation portion on the outer peripheral sides of the upper wafer W1 and lower wafer W2 are distinguished, as indicated by a thick line in FIG. 14B. As shown in FIG. 15A, at this boundary point BP, the lower wafer W2 is pulled toward the upper wafer W1, so that the lower wafer W2 is contracted. For example, when the attracting pressures of the zones of ch2 and ch3 are not strengthened (when −20 kPa is continued), the lower wafer W2 may be greatly contracted, causing the distortion.

Figure 14C:
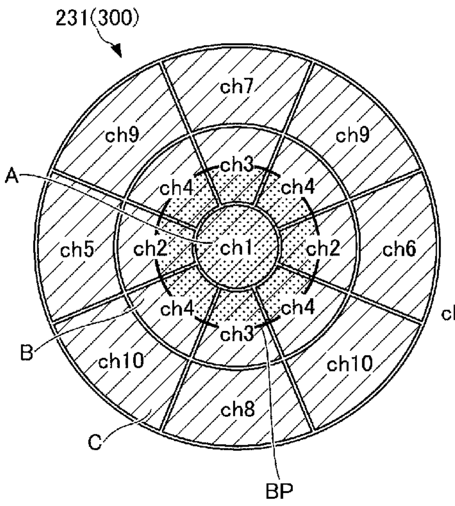
FIG. 14C is a plan view showing an attracting pressure distribution when the bonding progresses.
Figure 15B:
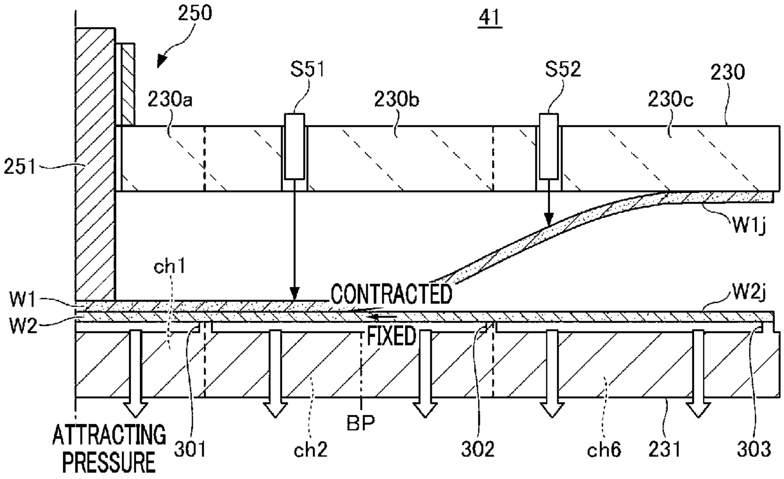
FIG. 15B is a cross sectional view illustrating a state in which the attracting pressure distribution is switched to an attracting pressure distribution in the progress of the bonding when the progress of the bonding is temporarily stopped.

To solve the problem, the control device 90 performs a switchover from the beginning attracting pressure distribution to the progress attracting pressure distribution as shown in FIG. 14C after the progress of the bonding is temporarily stopped. That is, the switching time point tr is set between the timing when the progress of the bonding is temporarily stopped and the time point t2 at which the attraction of the region 230*c* is released (see FIG. 13B). In the progress attracting pressure distribution, the attraction surface 300 of the lower chuck 231 is set to have the attracting pressure of −100 kPa in all the zones, so that the portion of the lower wafer W2 at the outer side than the boundary point BP is firmly attracted to the lower chuck 231. As a result, as shown in FIG. 15B, the contraction of the lower wafer W2 is suppressed, and the distortion of the lower wafer W2 can be alleviated.

Figure 14D:
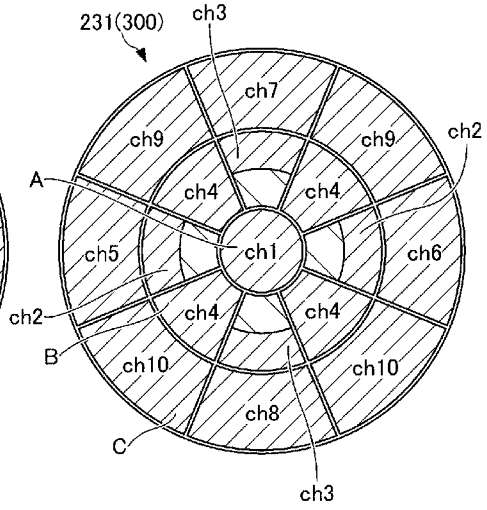
FIG. 14D is a plan view showing an attracting pressure applied to a lower wafer during the bonding.

As a consequence, the lower chuck 231 attracts the lower wafer W2 with the attracting pressures as shown in FIG. 14D during the progress of the bonding. That is, the lower chuck 231 attracts the lower wafer W2 with a weak attracting pressure on the center side of the zones of ch2 and ch3 of the intermediate region B, thus allowing the upper wafer W1 and the lower wafer W2 near the center to be smoothly bonded. Further, the lower chuck 231 fixes the lower wafer W2 with a strong attracting pressure on the outer peripheral side of the zones of ch2 and ch3 of the intermediate region B, thus suppressing the deviation between the bonding surface W1*j* of the upper wafer W1 and the bonding surface W2*j* of the lower wafer W2 to thereby bond them with high precision.

As described above, the bonding apparatus 1 performs the switchover from the beginning attracting pressure distribution to the progress attracting pressure distribution during the progress of the bonding, thus allowing the lower wafer W2 to be appropriately fixed as the bonding of the upper wafer W1 and the lower wafer W2 progresses. As a result, the bonding apparatus 1 is able to suppress the distortion that may be caused to the lower wafer W2 during the progress of the bonding, thus capable of bonding the two sheets of substrates (the upper wafer W1 and the lower wafer W2) with high precision.

In addition, by setting the switching time point tr to the timing after the progress of the bonding is temporarily stopped, the bonding apparatus 1 is capable of bonding the lower wafer W2 to the upper wafer W1 appropriately until the progress of the bonding from the centers of the upper wafer W1 and the lower wafer W2 is temporarily stopped. Then, by setting the progress attracting pressure distribution to be maintained until the upper chuck 230 releases the attraction of the outer periphery of the upper wafer W1, the bonding apparatus 1 is capable of smoothly suppressing the distortion that may occur at the outer peripheral side of the lower wafer W2 after the attraction is released.

Further, by switching from the beginning attracting pressure distribution to the progress attracting pressure distribution at the time when the boundary point BP between the upper wafer W1 and the lower wafer W2 is located in the intermediate region B, the bonding apparatus 1 is capable of appropriately adjusting the influence of the attracting pressure of the intermediate region B during the progress of the bonding. Further, in the beginning attracting pressure distribution, by setting the zones of ch1 and ch4 to ch10 to the first attracting pressure while setting the other zones of ch2 and ch3 to the second attracting pressure, the lower wafer W2 can be easily moved according to the bonding force of the upper wafer W1. Therefore, the bonding at the centers of the upper wafer W1 and the lower wafer W2 can be carried out more stably.

Meanwhile, in the progress attracting pressure distribution, by setting all the regions to have the same attracting pressure (first attracting pressure), the bonding apparatus 1 is capable of uniformly fixing the entire non-bonding surface W2*n* of the lower wafer W2. Thus, the distortion of the lower wafer W2 that may be caused by different attracting pressures can be more reliably avoided.

In addition, the bonding apparatus 1 and the substrate processing method of the present disclosure are not limited to the above-described exemplary embodiment, and various modifications may be made. For example, the switchover between the beginning attracting pressure distribution and the progress attracting pressure distribution is not limited to being performed between the time point t1' at which the progress of the bonding is temporality stopped and the time when the attraction of the region 230*c* is released. For example, it may be performed earlier than the time point t1'.

Furthermore, in the beginning attracting pressure distribution, the attracting pressures of the zones of ch1 and ch4 to ch10 are not limited to −100 kPa, and may be appropriately set according to the internal pressure of the processing vessel 210 or the like. Likewise, in the progress attracting pressure distribution, the second attracting pressure of the zones of ch2 and ch3 may be arbitrarily set by a user in the range of, e.g., about 0 kPa to about −40 kPa as long as it is weaker than the attracting pressures of the adjacent zones ch1, ch4, and ch5 to ch8.

The second attracting pressure in the beginning attracting pressure distribution is not limited to the zones of ch2 and ch3. For example, the zone of ch2 alone or the zone of ch3 alone may be set to have the second attracting pressure, or the zone of ch4 may be set to have the second attracting pressure. The bonding apparatus 1 may set the zone of ch1 to have the second attracting pressure. The bonding apparatus 1 may automatically change the channels of the second attracting pressure according to, for example, a bending state of the lower wafer W2 measured by a bending measuring device 5 (see FIG. 1). Thus, only any one of the zones in the intermediate region B may be set to have the second attracting pressure, or all the zones in the intermediate region B may be set to have the second attracting pressure. In addition, in the beginning attracting pressure distribution, the bonding apparatus 1 may set some of the zones of the outer region C to have the second attracting pressure.

Alternatively, the bonding apparatus 1 may set three or more types of attracting pressures in the beginning attracting pressure distribution. By way of example, the central region A (ch1) may be set to have a third attracting pressure different from the attracting pressure (−20 kPa) of the zones of ch2 and ch3 of the intermediate region B and the attracting pressure (−100 kPa) of the zone of ch4. Likewise, the outer region C (ch5 to ch10) may be set to have a fourth attracting pressure different from the attracting pressure of the intermediate region B. On the contrary, the bonding apparatus 1 may set the first attracting pressure common to all the zones in the beginning attracting pressure distribution, and may change all or some of the zones to have the second attracting pressure different from (stronger than) the first attracting pressure in the progress attracting pressure distribution.

Also, the progress attracting pressure distribution is not limited to setting the attracting pressures of all the zones to a single type of attracting pressure (first attracting pressure), but the zones may have different attracting pressures. For example, the attracting pressures of the zones of ch2 and ch3 in the beginning attracting pressure distribution only needs to be stronger than −20 kPa, so they may be set to be stronger than the first attracting pressure (−100 kPa) or may set to be weaker than the first attracting pressure.

In short, as long as the lower chuck 231 can appropriately fix the lower wafer W2 during the bonding, the attracting pressures in the beginning attracting pressure distribution and the attracting pressures in the progress attracting pressure distribution may be arbitrarily set by the user. By way of example, there may be performed a control of attracting the lower wafer W2 with a strong attracting pressure in each region in the beginning attracting pressure distribution, and then switching to an attracting pressure weaker than that of the beginning attracting pressure distribution in each region in the progress attracting pressure distribution.

Here, it should be noted that the bonding apparatus 1 and the bonding method according to the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, the two sheets of substrates can be bonded to each other with high precision.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A bonding apparatus, comprising:

a first holder configured to hold a first substrate;

a second holder, allowed to be disposed at a position facing the first holder, having an attraction surface partitioned into multiple regions configured to attract a second substrate;

an attracting pressure generator configured to generate attracting pressures in the multiple regions individually;

a pushing member configured to press a central portion of the first substrate toward the second substrate to bond the first substrate to the second substrate; and a controller configured to control the attracting pressure generator and the pushing member, wherein the controller attracts the second substrate with a beginning attracting pressure distribution set on the multiple regions, when a pressurization of the first substrate by the pushing member is begun, the controller performs a control of performing a switchover from the beginning attracting pressure distribution to a progress attracting pressure distribution between a time point when the pressurization by the pushing member is begun and a contact end point at which an entire bonding surface of the first substrate and an entire bonding surface of the second substrate come into contact with each other, wherein the controller is configured to control the switchover such that distortion of at least one of the first substrate and the second substrate during bonding is suppressed, and the progress attracting pressure distribution is created by changing at least one attracting pressure of the attracting pressures on the multiple regions in the beginning attracting pressure distribution.

2. The bonding apparatus of claim 1, wherein a timing of performing the switchover from the beginning attracting pressure distribution to the progress attracting pressure distribution is a timing after a bonding between a center of the first substrate and a center of the second substrate is performed, a progress of the bonding is performed from the centers of the first substrate and the second substrate toward outer peripheries thereof, and then the progress of the bonding is temporarily stopped.

3. The bonding apparatus of claim 2, wherein the progress of the bonding is temporarily stopped by attracting, after the time point when the pressurization is begun, the outer periphery of the first substrate with the first holder, and the timing of performing the switchover from the beginning attracting pressure distribution to the progress attracting pressure distribution is a time before the first holder releases the attracting of the outer periphery of the first substrate.

4. The bonding apparatus of claim 1, wherein the attraction surface has a circular central region, an annular intermediate region disposed outside and adjacent to the central region, and an annular outer region disposed outside and adjacent to the intermediate region, and a boundary point between a bonding portion and a separation portion in the first substrate and the second substrate at a time when the switchover from the beginning attracting pressure distribution to the progress attracting pressure distribution is performed is located in the intermediate region.

5. A bonding apparatus, comprising:

a first holder configured to hold a first substrate;

a second holder, allowed to be disposed at a position facing the first holder, having an attraction surface partitioned into multiple regions configured to attract a second substrate;

an attracting pressure generator configured to generate attracting pressures in the multiple regions individually;

a pushing member configured to press a central portion of the first substrate toward the second substrate to bond the first substrate to the second substrate; and a controller configured to control the attracting pressure generator and the pushing member, wherein the controller attracts the second substrate with a beginning attracting pressure distribution set on the multiple regions, when a pressurization of the first substrate by the pushing member is begun, the controller performs a control of performing a switchover from the beginning attracting pressure distribution to a progress attracting pressure distribution between a time point when the pressurization by the pushing member is begun and a contact end point at which an entire bonding surface of the first substrate and an entire bonding surface of the second substrate come into contact with each other, and the progress attracting pressure distribution is created by changing at least one attracting pressure of the attracting pressures on the multiple regions in the beginning attracting pressure distribution, wherein the attraction surface has a circular central region, an annular intermediate region disposed outside and adjacent to the central region, and an annular outer region disposed outside and adjacent to the intermediate region, and a boundary point between a bonding portion and a separation portion in the first substrate and the second substrate at a time when the switchover from the beginning attracting pressure distribution to the progress attracting pressure distribution is performed is located in the intermediate region, wherein the multiple regions include the central region, multiple small intermediate regions obtained by dividing the intermediate region along a circumferential direction, and multiple small outer regions obtained by dividing the outer region along the circumferential direction, and in the beginning attracting pressure distribution, first parts of the multiple small intermediate regions are set to have a first attracting pressure, and second parts of the multiple small intermediate regions are set to have a second attracting pressure different from the first attracting pressure.

6. The bonding apparatus of claim 5, wherein, in the beginning attracting pressure distribution, the central region and the multiple small outer regions are set to have the first attracting pressure, and in the progress attracting pressure distribution, the central region, the multiple small intermediate regions, and the multiple small outer regions are all set to have the first attracting pressure.

7. The bonding apparatus of claim 1, wherein, in the beginning attracting pressure distribution, first parts of the attracting pressures on the multiple regions are made to be weaker than second parts of the attracting pressures on the multiple regions, and in the progress attracting pressure distribution, the first parts of the attracting pressures on the multiple regions are set to be strong.

8. A bonding method, comprising:

holding a first substrate with a first holder;

attracting a second substrate by generating, in a second holder which is allowed to be disposed at a position facing the first holder and which has an attraction surface partitioned into multiple regions, attracting pressures in the multiple regions individually from an attracting pressure generator; and bonding the first substrate and the second substrate by pressing a central portion of the first substrate toward the second substrate with a pushing member, wherein when a pressurization of the first substrate by the pushing member is begun, the second substrate is attracted with a beginning attracting pressure distribution set on the multiple regions, in the bonding of the first substrate and the second substrate, a control of performing a switchover is performed from the beginning attracting pressure distribution to a progress attracting pressure distribution between a time point when the pressurization by the pushing member is begun and a contact end point at which an entire bonding surface of the first substrate and an entire bonding surface of the second substrate come into contact with each other, wherein the control includes controlling the switchover such that distortion of at least one of the first substrate and the second substrate during bonding is suppressed, and the progress attracting pressure distribution is created by changing at least one attracting pressure of the attracting pressures on the multiple regions in the beginning attracting pressure distribution.

* * * * *